United States Patent [19]

Inoue et al.

[11] Patent Number: 5,786,627
[45] Date of Patent: Jul. 28, 1998

[54] INTEGRATED CIRCUIT DEVICE AND FABRICATING THEREOF

[75] Inventors: Akira Inoue; Kei Goto; Yoshihiro Notani; Yasuharu Nakajima; Hiroto Matsubayashi; Yukio Ohta, all of Tokyo, Japan

[73] Assignee: Mitsubishi Denki Kabushiki Kaisha, Tokyo, Japan

[21] Appl. No.: 956,497

[22] Filed: Oct. 22, 1997

Related U.S. Application Data

[63] Continuation of Ser. No. 565,451, Feb. 1, 1996, abandoned.

[30] Foreign Application Priority Data

Apr. 20, 1995 [JP] Japan ................... 7-094963

[51] Int. Cl.⁶ ................ H01L 23/02; H01L 23/52
[52] U.S. Cl. ..................... 257/679; 257/691
[58] Field of Search ..................... 257/679, 691

[56] References Cited

U.S. PATENT DOCUMENTS

| | | |
|---|---|---|
| 4,296,424 | 10/1981 | Shibasaki et al. .......... 174/68.5 |
| 4,401,966 | 8/1983 | Ohmura et al. ............. 338/32 |
| 5,084,107 | 1/1992 | Deguchi et al. ............ 136/256 |
| 5,146,296 | 9/1992 | Huth ........................ 313/354 |
| 5,598,032 | 1/1997 | Fidalgo ..................... 257/679 |

FOREIGN PATENT DOCUMENTS 515278   2/1993   Japan .

*Primary Examiner*—Stephen Meier
*Attorney, Agent, or Firm*—Leydig, Voit & Mayer, Ltd.

[57] ABSTRACT

An integrated circuit device includes a substrate, circuit elements on the substrate, and an electrically conductive thermoplastic resin substance electrically connecting the circuit elements on the substrate. Therefore, since variations in the configuration of the thermoplastic resin are quite small relative to those of interconnecting wires, variation in parasitic inductance due to variation in the configuration of the connections is reduced and the uniformity and the reproducibility of the high frequency characteristics of the integrated circuit device are enhanced. A method for fabricating an integrated circuit device includes forming circuit elements on a substrate and forming an electrically conducting thermoplastic resin substance electrically connecting the circuit elements.

7 Claims, 4 Drawing Sheets

INTEGRATED CIRCUIT DEVICE AND FABRICATING THEREOF

This disclosure is a continuation of patent application Ser. No. 08/565,451, filed Feb. 1, 1996 now abandoned.

FIELD OF THE INVENTION

The present invention relates to an integrated circuit device and a fabricating method thereof and, more particularly, to an integrated circuit device used at high frequency and a fabricating method thereof.

BACKGROUND OF THE INVENTION

Figure 4:
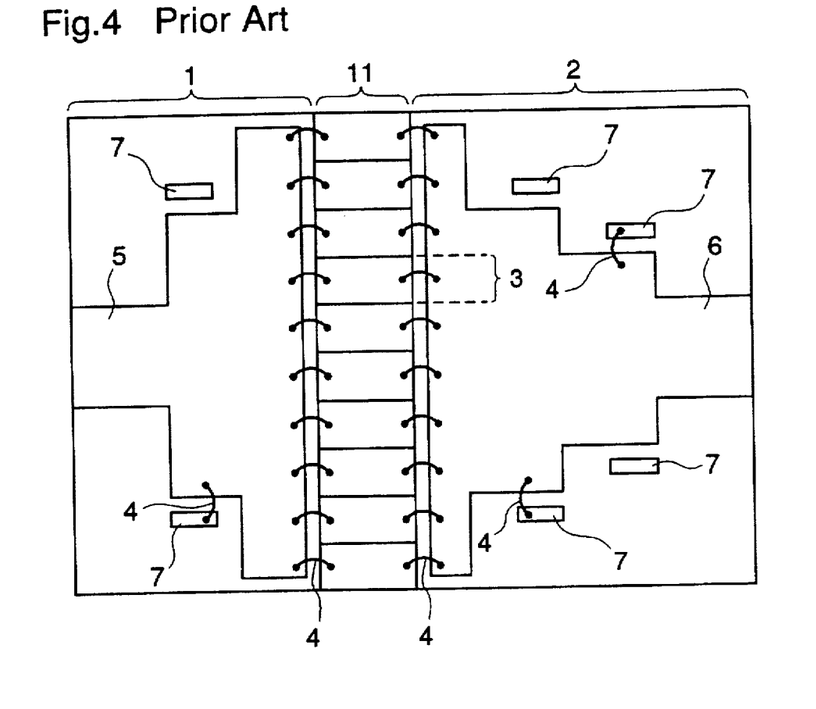
FIG. 4 is a plan view illustrating a prior art integrated circuit device.

FIG. 4 is a plan view of a prior art integrated circuit device. In the figure, reference numeral 1 designates an input side substrate. Numeral 2 designates an output side substrate. Numeral 3 designates a field effect transistor (hereinafter referred to as FET). Numeral 4 designates a wire comprising Au and the like. Numeral 5 designates an impedance matching circuit disposed on the input side substrate 1. Numeral 6 designates an output impedance matching circuit disposed on the output side substrate 2. Numeral 7 designates a land comprising a conductor film comprising Au and the like. Numeral 11 designates a semiconductor substrates. Each of the substrate 1, 2 comprises a dielectric substance comprising alumina and the like and each of the input and output impedance matching circuits comprises a conductor film comprising Au and the like.

Figure 5:
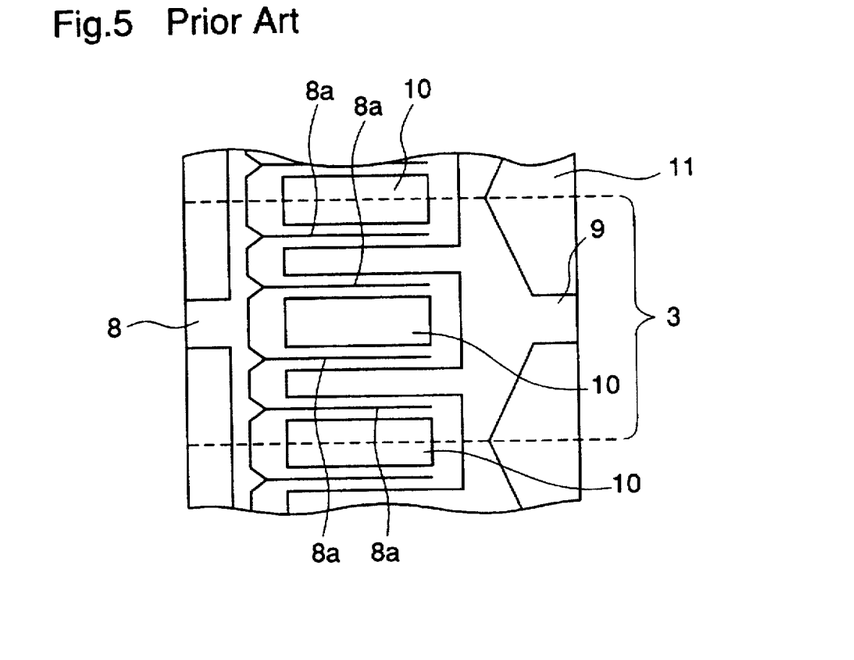
FIG. 5 is a diagram illustrating in enlarged view an FET of the prior art integrated circuit device.

FIG. 5 shows an enlarged view of FET 3 shown in FIG. 4. In the figure, numeral 8 designates a gate electrode, numeral 9 designates a drain electrode, and numeral 10 designates a source electrode. Numeral 11 designates a semiconductor substrate comprising GaAs, Si and the like. A plurality of FETs 3 are provided on the semiconductor substrate 11. This semiconductor substrate 11 is integral, i.e., a single unit, over all the FETs, and the gate electrodes 8 and drain electrodes 9 of adjacent FETs are also integrated, respectively. This is because unless the electrodes of adjacent FETs are connected, an undesirable loop is formed to which is apt to cause an oscillation. In addition, the gate electrodes 8 and the drain electrodes 9 of respective FETs 3 are connected with the input impedance matching circuit 5 on the input side substrate 1 and the output impedance matching circuit 6 on the output side substrate 2 by the wires 4 shown in FIG. 4, respectively. Although not shown in the figure, the source electrodes 10 are mutually connected by air bridge wirings and they are connected with a metal layer at the rear surface of the semiconductor substrate 11 through via-holes. In this example, the FET 3 has four comb type gates 8a. Though no insulating film for protecting the surface of the FET is formed in this example, when such a protecting insulating film is formed, insulating film apertures each having a size of about 100 μm×100 μm may be formed at regions in the vicinity of the positions of the gate electrode 8 and the drain electrode 9 where the wires 4 are to be connected, so that the wire bonding can be performed in the apertures.

In this integrated circuit device, the input signal is supplied to the gate electrode of respective FETs 3 via the input impedance matching circuit 5 and the signals amplified by respective FETs are transmitted to the output impedance matching circuit 6 from the respective drain electrodes, synthesized, i.e., combined, thereat.

Generally, the impedance matching at a high frequency band which is higher than the microwave band can be adjusted by changing the pattern width and the length of the input and output impedance matching circuits. Actually, lands 7 as island shaped conductor patterns are previously formed on the substrate 1 and 2, respectively, and are connected with the impedance matching circuit patterns 5, 6 as required, so as to adjust the impedances.

In the adjustment employing the wire 4, however, it is required to previously form the lands 7 on the substrate, and continuous adjustment of impedance cannot be performed, only discrete adjustments can be made. In addition, in order to bond the wire 4 to the electrode of the FET, it is required to secure a space of more than 100 μm square on an electrode, and it was difficult to adjust the impedance by providing lands at a fine region on the semiconductor substrate 11 and to connect the lands with the electrodes of FETs via the wires. In addition, the wires 4 are curved in their shapes, causing variations in their inductances and capacitances dependent on variations in the shapes of the wires, thereby deteriorating the electrical characteristics at high frequency. Therefore, it was difficult to enhance the precision of impedance matching.

In the above-described integrated circuit device, a plurality of FETs 3 are formed on the same semiconductor substrate 11, and the gate electrodes 8, the source electrodes 10, and the drain electrodes 11 of the FETs are respectively connected with each other between the FETs when the FETs are fabricated, whereby the electrical characteristics of each individual FET cannot be measured. Accordingly, when the DC characteristic is inspected immediately after the integrated circuit device is fabricated, only the averaged characteristic of all the FETs is obtained, and any nonuniformity of operation over the FETs cannot be evaluated. Therefore, even when a failure concerning the electrical characteristic arises in this integrated circuit, the FET which causes the failure cannot be specified, resulting in difficulty in enhancing the fabrication yield.

The above-described integrated circuit device has additionally a problem that undesirable feedback is likely to occur between the respective FETs and accordingly, an undesirable oscillation is likely to occur.

The above-described integrated circuit device has furthermore a problem that since the input side substrate 1 or the output side substrate 2 and each of the FETs formed on the semiconductor substrate are connected by the wires 4, the lengths of the wires which are connected to respective FETs are different dependent on differences in the curved shapes of the wires, thereby resulting in a difference in the parasitic inductances of the respective wires. Thus, the synthesis efficiency at the output side of the signals from the respective FET cells at a high frequency is deteriorated and variations in the high frequency characteristics are increased.

As described above, in the above-described prior art integrated circuit device, adjustment of the impedance matching can be only performed discretely using lands, and the precision of adjustment of impedance matching is deteriorated by the influence of the shapes of the wires. In addition, since nonuniformity of operation of each FET cell cannot be evaluated, it is difficult to enhance the fabrication yield. Furthermore, undesirable oscillation is likely to arise due to undesirable feedback, and the synthesis efficiency of a high frequency signal is also reduced.

SUMMARY OF THE INVENTION

It is an object of the present invention to provide an integrated circuit device in which impedance matching can be performed with high precision and continuously nonuniform operation of individual FET cells can be identified and undesirable oscillation prevented, thereby producing an efficient synthesis of a high frequency signal.

It is another object of the present invention to provide a fabricating method of such an integrated circuit device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an integrated circuit device comprises a substrate comprising a semiconductor or a dielectric material, and circuit elements an d thermoplastic resin substance electrically connected to the circuit elements disposed on the substrate. Therefore, since variation in the configuration of the thermoplastic resin substance is quite small relative to those of the wires, variation in the parasitic inductance due to variation in the configuration is reduced, and uniformity and reproducibility of the high frequency characteristics of the integrated circuit device are enhanced.

According to a second aspect of the present invention, in the above-described integrated circuit device, the circuit elements are provided in plurality, the circuit elements are disposed on a plurality of the substrates, and the thermoplastic resin substances electrically connect between the circuit elements. Therefore, since variation in the configuration of the thermoplastic resin substance is quite small relative to those of the wires, variation in the parasitic inductance due to variation in the configuration is reduced, and uniformity and reproducibility of the integrated circuit device are enhanced. In addition, since the parasitic inductance of thermoplastic resin is reduced in its variation as well as in its value itself as compared with that of the wire, when the drain electrodes of the plurality of transistors formed on the semiconductor substrate and the output impedance matching circuits formed on the dielectric substrate comprising such as alumina are connected by the thermoplastic resin, the synthesis efficiency of signals in the high frequency band can be enhanced, and reproducibility of signals can be further enhanced.

According to a third aspect of the present invention, in the above-described integrated circuit device, the circuit element includes an impedance matching circuit part provided on the substrate, and the thermoplastic resin substance forms an impedance matching circuit with the impedance matching circuit part by connecting one end of the thermoplastic resin substance to the impedance matching circuit. Therefore, the configurations of the thermoplastic resin and a portion thereof to be connected to the impedance matching circuit part can be made arbitrary and the adjustment of the impedance matching can be performed continuously and with high precision.

According to an fourth aspect of the present invention, in the above-described integrated circuit device, the circuit elements include an impedance matching circuit part provided on the substrate and lands each comprising an island conductor film provided on the substrate, and the thermoplastic resin substance is provided to connect the impedance matching circuit part with the land, and the impedance matching circuit part and the thermoplastic resin substance form the impedance matching circuit with the lands connected to the thermoplastic resin substance. Therefore, when performing the adjustment of the impedance matching, variation in the parasitic inductance of the thermoplastic resin is reduced as compared with a case where these are connected by wires, and uniformity and reproducibility of the high frequency characteristics of the impedance matching circuits can be enhanced. In addition, since the width of the thermoplastic resin can be made arbitrary, the adjustment of the impedance matching can be performed continuously and with high precision.

According to a fifth aspect of the present invention, an integrated circuit device includes circuit elements including a plurality of transistors formed on a substrate comprising a semiconductor or a dielectric material, and conductive wirings electrically directly connecting, at least one selected among mutually between the gate electrodes, mutually between the source electrodes, and mutually between the drain electrodes of the plurality of transistors. Therefore, the electrical characteristics of the respective transistors can be measured before the conductive wirings are formed, uniformity of operation characteristics of the transistor can be evaluated, and the integrated circuit device can be constituted by only using the transistors having uniform characteristics, whereby the fabrication yield of the integrated circuit device can be enhanced.

According to a sixth aspect of the present invention, an integrated circuit device includes circuit elements including a plurality of transistors and electrical resistors formed at regions between some of the plurality of transistors formed on a substrate comprising a semiconductor or a dielectric material, and conductive wirings electrically connecting directly or via the electrical resistors, at least one selected among mutually between the gate electrodes, mutually between the source electrodes, and mutually between the drain electrodes of the plurality of transistors. Therefore, it is possible to form an integrated circuit device by only using the transistors having the uniform characteristics, thereby enhancing the fabrication yield. Further, even when an transistor is found to be oscillating in the measurement of the electrical characteristics of the respective transistors, the oscillation of the transistor can be easily prevented by connecting the electrodes of the respective transistors via the electrical resistors or directly, in accordance with the oscillation characteristics.

According to a seventh aspect of the present invention, an integrated circuit device includes circuit elements including transistors provided on a substrate comprising a semiconductor or a dielectric material, and a magnetic material provided on the transistor or on a region adjacent to the transistor on the substrate. Therefore, the unrequited oscillation of the transistor can be attenuated, and this oscillation can be prevented.

According to a eighth aspect of the present invention, in the above-described integrated circuit device, the magnetic material is adhered to the transistor or the substrate by thermoplastic resin. Therefore, the undesirable oscillation of the transistor can be attenuated, and this oscillation can be prevented.

According to a ninth aspect of the present invention, a method for fabricating an integrated circuit device includes forming circuit elements on a substrate comprising a semiconductor or a dielectric material, and forming thermoplastic resin substance electrically connected with the circuit elements. Therefore, since variation in the configuration of the thermoplastic resin is quite small with relative to those of the wires, variation in the parasitic inductance due to variation in the configuration is reduced and uniformity and reproducibility of the high frequency characteristics of the integrated circuit device are enhanced.

According to a tenth aspect of the present invention, the fabricating method of an integrated circuit device further includes forming the circuit elements including an input impedance matching circuit to be formed on a first substrate comprising dielectric material, transistors to be formed on a second substrate comprising a semiconductor, and an output impedance matching circuit to be formed on a third substrate comprising dielectric material, and forming the thermoplastic resin substance connecting mutually between the input impedance matching circuit and the gate electrodes of the transistors and between the drain electrodes of the transistors and the output impedance matching circuit. Therefore, not only uniformity and reproducibility of the high frequency characteristics of the integrated circuit device can be enhanced, but also since the parasitic inductance of the thermoplastic resin is reduced in its variation and in the value itself as compared with that of the wire, when the drain electrodes of the plurality of transistors formed on a semiconductor substrate and the output impedance matching circuits formed on a dielectric material such as alumina are connected by the thermoplastic resin, the synthesis efficiency of signals in the high frequency band is enhanced, thereby further enhancing the reproducibility.

According to a eleventh aspect of the present invention, the above-described fabricating method of an integrated circuit device further comprises, after forming the circuit elements, measuring the electrical characteristics of the circuit elements, and after measuring the characteristics of the circuit elements, forming the thermoplastic resin substance in accordance with the electrical characteristics. Therefore, not only the uniformity and the reproducibility of the high frequency characteristics of the integrated circuit device can be enhanced, and the synthesis efficiency of signals at the high frequency band is enhanced, but the optimization of the thermoplastic resin can be performed easily.

According to a twelfth aspect of the present invention, the fabricating method of an integrated circuit device includes forming the circuit elements including an impedance matching circuit, and after forming the circuit elements, measuring the high frequency characteristics of the circuit elements, and forming the thermoplastic resin substance in accordance with the high frequency characteristics of the circuit elements to be connected with the impedance matching circuit part thereby to form the impedance matching circuit including the thermoplastic resin substance and the impedance matching circuit part. Therefore, even when the characteristics of the circuit elements are varied and a sufficient impedance matching cannot be achieved by the impedance matching circuit part, it is possible to form an appropriate configuration thermoplastic resin at an appropriate position of the impedance matching circuit part, and the impedance matching circuit which can perform the impedance matching at respective integrated circuits can be formed. In other word, the adjustment of the impedance matching can be performed continuously and with high precision.

According to a thirteenth aspect of the present invention, the above-described fabricating method of an integrated circuit device includes forming an impedance matching circuit and circuit elements including one or a plurality of lands comprising island shaped conductor film, after forming the circuit elements, measuring the high frequency characteristics of the circuit elements, and after measuring the high frequency characteristics of the circuit elements, forming the thermoplastic resin substance in accordance with the high frequency characteristics of the circuit elements connecting those selected among the lands and the impedance matched circuit part, thereby forming the impedance matched circuit including the thermoplastic resin material, the selected lands and the impedance matching circuit part. Therefore, even when the characteristics of the circuit elements are varied and a sufficient impedance matching cannot be achieved by the impedance matching circuit part, it is possible to select an appropriate land from the previously formed lands and connect this land with the impedance matching circuit part by the thermoplastic resin, and thus the impedance matching circuit which can perform the impedance matching at respective integrated circuits can be formed. In addition, the variations of the configuration of the thermoplastic resin are less than those of the wires as compared with a case where the lands and the impedance matching circuit part are connected with each other by the conventional wires, and accordingly, the variations in the parasitic inductance due to the variations in the configurations are reduced, whereby the uniformity and the reproducibility of the high frequency characteristics of the impedance matching circuits can be enhanced. In addition, in accordance with high frequency characteristics measured of the circuit elements, the width of the thermoplastic resin can be made an arbitrary one, whereby the adjustment of the impedance matching can be performed continuously and with high precision.

According to a fourteenth aspect of the present invention, a method for fabricating an integrated circuit device includes forming circuit elements including a plurality of transistors on a substrate comprising a semiconductor or a dielectric material, and forming conductive wirings electrically and directly connecting, at least one selected among mutually between the gate electrodes, mutually between the source electrodes, and mutually between the drain electrodes of the plurality of transistors. Therefore, it is possible to measure the electrical characteristics of the respective transistors before forming the conductive wirings, and uniformity of the operating characteristics of the transistor can be evaluated, and the integrated circuit device can be constructed by only using the transistors having uniform characteristics, whereby the fabrication yield of the integrated circuit device can be enhanced.

According to a fifteenth aspect of the present invention, a method for fabricating an integrated circuit device includes forming circuit elements including a plurality of transistors and electrical resistors in positions between some of the transistors on a substrate comprising a semiconductor or a dielectric material, and forming conductive wirings electrically connecting, at least one selected among mutually between the gate electrodes, mutually between the source electrodes, and mutually between the drain electrodes of the plurality of transistors directly or through the resistors. Therefore, it is possible to form an integrated circuit device by only using the transistors having the uniform characteristics, thereby enhancing the fabrication yield. Further, when the electrical characteristics of the respective transistors are measured before forming the conductive wirings and when these transistors are oscillating, the electrodes of the transistors are connected via the electrical resistors or directly, whereby the oscillation of the transistor can be easily prevented.

According to a sixteenth aspect of the present invention, the above-described fabricating method of an integrated circuit device further includes, after forming the circuit elements, measuring the electrical characteristics of the respective transistors, and after measuring the electrical characteristics of the respective transistors, forming the conductive wirings in accordance with the electrical characteristics of the respective transistors. Therefore, uniformity of the operating characteristics of the transistors can be evaluated and the integrated circuit device can be constructed by only using the transistors having uniform characteristics. Thereby, it is possible to enhance the fabrication yield of the integrated circuit device. In addition, when the transistor is oscillating, by connecting the electrodes of the transistor via electrical resistor or directly in accordance with the oscillating characteristics, the oscillation can be easily prevented.

According to a seventeenth aspect of the present invention, a fabricating method of an integrated circuit device comprises forming circuit elements including transistors on a substrate comprising a semiconductor or a dielectric material, and forming a magnetic material on the transistor or in a region adjacent to the transistor on the substrate. Therefore, the unnecessary oscillation of the transistor can be attenuated and this oscillation can be prevented.

According to a eighteenth aspect of the present invention, the above-described fabricating method of an integrated circuit device further includes, after forming the circuit elements, measuring the electrical characteristics of the respective transistors, and forming the magnetic substance in accordance with the electrical characteristics. Therefore, magnetic material of an appropriate configuration can be formed on an appropriate position, and the oscillation of the transistor can be easily prevented.

DETAILED DESCRIPTION OF THE PREFERRED EMBODIMENTS

Embodiment 1

A description is given of a first embodiment of the present invention.

Figure 1:
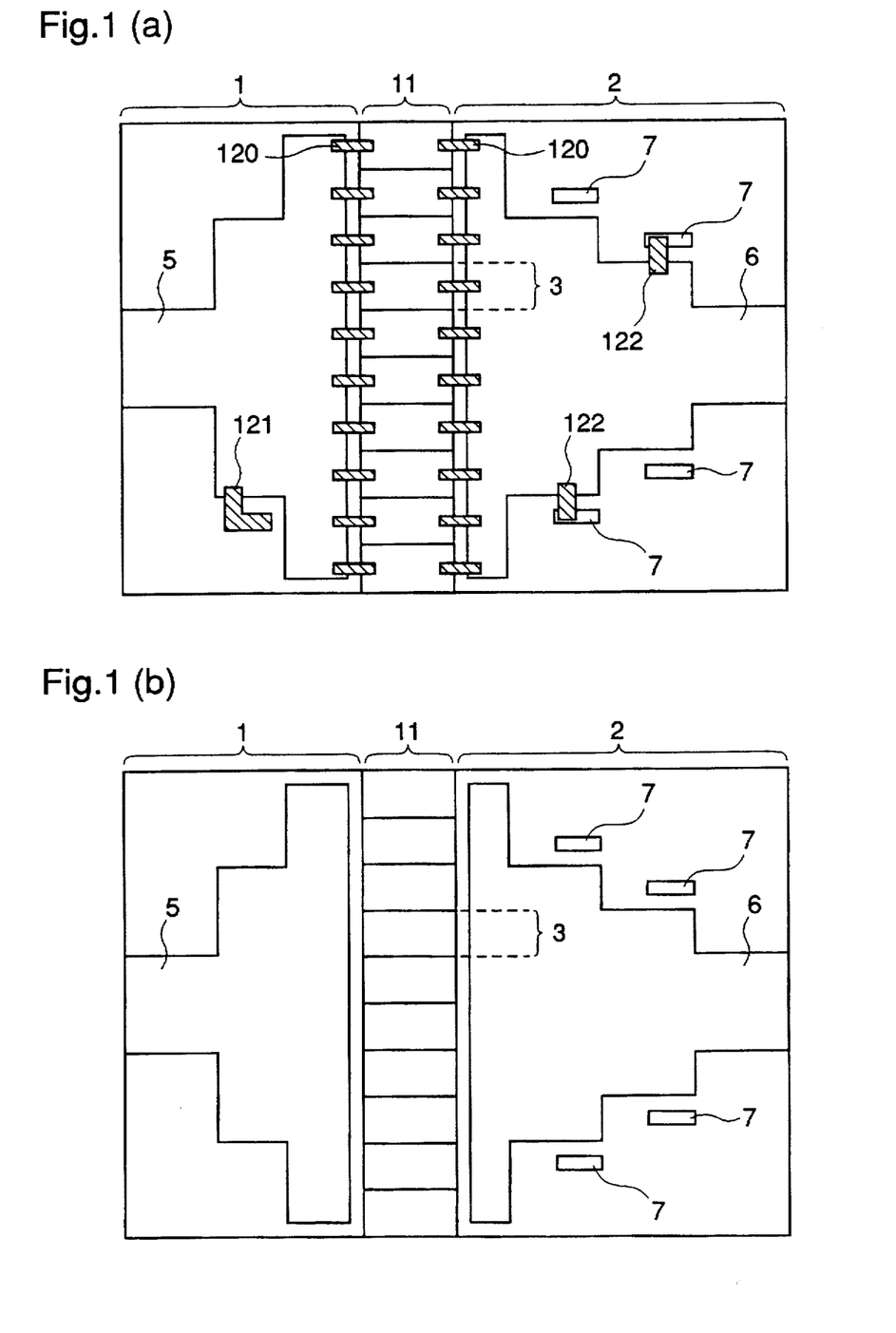
FIGS. 1(a) and 1(b) are a plan view illustrating an integrated circuit device according to a first embodiment of the present invention and a plan view illustrating a fabricating method therefor, respectively.

FIG. 1(a) is a plan view illustrating an integrated circuit device in accordance with a first embodiment. In FIG. 1(a), reference numeral 1 designates an input side substrate. Numeral 2 designates an output side substrate. Numeral 3 designates an FET. Numeral 5 designates an input impedance matching circuit disposed on the input side substrate 1. Numeral 6 designates an output impedance matching circuit disposed on the output side substrate 2. Numeral 7 designates a land comprising a conductor film such as Au and the like formed on the output side substrate 2. Numeral 11 designates a semiconductor substrate comprising GaAs, Si and the like. Numerals 120, 121, 122 designate a thermoplastic resin substance such as thermoplastic polyimide including conductive particles. The substrates 1, 2 comprise a dielectric substance such as alumina and the like, and the input and output impedance matching circuits comprise conductor films such as Au and the like. A plurality of FETs 3 are disposed on the semiconductor substrate 11. The internal construction of the respective FETs 3 is the same as that shown in FIG. 5. The resistivity of the thermoplastic resin is about $10^{-4}$–$10^{-5}$ $\Omega$cm, and this is a value of resistivity that is higher than that of Au but that can be practically employed. The thermoplastic resin substance 120 connects the input impedance matching circuit 5 and the gate electrode of the FET 3 and also connects the drain electrode of the FET 3 and the output impedance matching circuit 6. The thermoplastic resin substance 121 has an end connected with the input impedance matching circuit 5. In addition, the thermoplastic substance 122 connects the output impedance matching circuit 6 and the land 7 comprising an island shaped conductor film provided in the vicinity of the output impedance matching circuit 6.

A description is given of a method of fabricating the integrated circuit device in accordance with the first embodiment of the present invention. FIG. 1(b) is a plan view illustrating the method of fabricating the integrated circuit device of this embodiment. In FIG. 1(b), the same reference numerals as in FIG. 1(a) designate the same parts. First of all, as shown in FIG. 1(b), on the input side substrate 1, an input impedance matching circuit 5 comprising a conductor film such as Au and the like is formed, on the semiconductor substrate 11, a plurality of FETs 3 are formed, and on the output side substrate 2 comprising a dielectric material such as alumina and the like, the output impedance matching circuit 6 and the lands 7 are formed, and these substrates are combined with each other. Next, the thermoplastic resin substance 120 is formed to connect the input impedance matching circuit 5 and the gate electrodes of the FETs 3 and connect the drain electrodes of the FETs 3 and the output impedance matching circuit 6. Thereafter, the high frequency characteristics over the input impedance matching circuit 5 and the output impedance matching circuit 6 are measured. In accordance with the measured high frequency characteristics, a thermoplastic resin substance 121 having an appropriate shape is formed with one end connected with an appropriate position of the input impedance matching circuit 5 so that the impedance matching is achieved at the input side, and a thermoplastic resin substance 122 is formed connecting the output impedance matching circuit 6 and an appropriately selected land 7 so that the impedance matching is achieved at the output side. The thermoplastic resin substances 120, 121, 122 are formed so that thermoplastic resin substances of arbitrary shapes are adhered to the substrate by patterning by etching or by attachment in a seal shape, and this is further heated to about 200°–250° C. by such as laser irradiation. In this way, the integrated circuit device shown in FIG. 1(a) is fabricated.

In this first embodiment, the input impedance matching circuit 5 on the input side substrate 1 and the gate electrode of the FETs 3 formed on the semiconductor substrate 11 are connected and the output impedance matching circuit 6 on the output side substrate 2 and the drain electrodes of the FETs 3 are connected by the thermoplastic resin substance 120, respectively. When these are connected by wires as in the above-described prior art integrated circuit device, the wires are formed floating above the surface of the substrate with their shapes curved, whereby the wire length is lengthened. Thus, the parasitic inductance increases and variations in its values dependent on variations in the configuration of the wires connected to the respective FETs 3 occur, thereby deteriorating the signal synthesis efficiency at a high frequency. On the contrary, the thermoplastic resin substance 120 is adhered to the substrate surface, thereby having no curved shape in its configuration and the width of the thermoplastic substance can be arbitrarily set with a high precision. Accordingly, a connection having a low impedance and less variation in impedance and having preferable reproducibility can be arbitrarily made. Therefore, the reproducibility of the signal synthesis efficiency and the synthesis efficiency itself can be enhanced.

In this first embodiment, since, as described above, the thermoplastic resin substance has a resistivity that is much lower than that of the conventional conductive resin such as silver paste, the thermoplastic resin substance 121 on the input side substrate 1 functions approximately equally to a conductor pattern comprising such as a metal film placed on the input impedance matching circuit 5. Therefore, after circuit elements such as an impedance matching circuit, FETs and the like are formed on the input side substrate 1, the output side substrate 2, and the semiconductor substrate 11, these substrates are combined to form an integrated circuit device, the high frequency characteristics of the integrated circuit device are measured, and the thermoplastic resin substances 121 are formed in accordance with the measured high frequency characteristics. Thereby, it is possible to adjust the impedance matching easily at the input side. Accordingly, it is not necessary to previously prepare lands in the vicinity of the input impedance matching circuit as in the prior art integrated circuit device. In addition, since it is possible to form a thermoplastic resin substance 121 having an arbitrary configuration at an arbitrary position, the degree of freedom in adjusting the impedance matching is increased. In other words, no discrete adjustment is performed by selecting lands which are to be connected as in the prior art integrated circuit device, but continuous adjustment is enabled. Furthermore, in the prior art integrated circuit device, since the wires used for connecting the lands and the impedance matching circuits are formed floating above the substrate surface, there occur variations in the high frequency characteristics due to variations in the curved configurations of the wires. On the contrary, in the first embodiment, variations in the high frequency characteristics are reduced because the thermoplastic resin substance having no curved configuration is attached onto the substrate surface.

In the first embodiment, the thermoplastic resin 122 on the output side substrate 2 is provided to connect between the land 7 and the output matching circuit 6. It is intended that since generally a large current flows through the output impedance matching circuit 6 at the output side, the conductor land 7 comprise a metal film having a lower resistivity than the thermoplastic resin in order to reduce the resistance of a portion added for adjusting the impedance matching so as to suppress loss in the output signal. In employing this thermoplastic resin substance 122, as in employing the input side thermoplastic resin substance 121, no influences in the high frequency characteristics due to the curved configurations of the wires arise and the width of the thermoplastic resin substance can be arbitrarily established, whereby continuous fine adjustment of the impedance matching at the output side is enabled.

Embodiment 2

A description is given of a second embodiment of the present invention.

Figure 2:
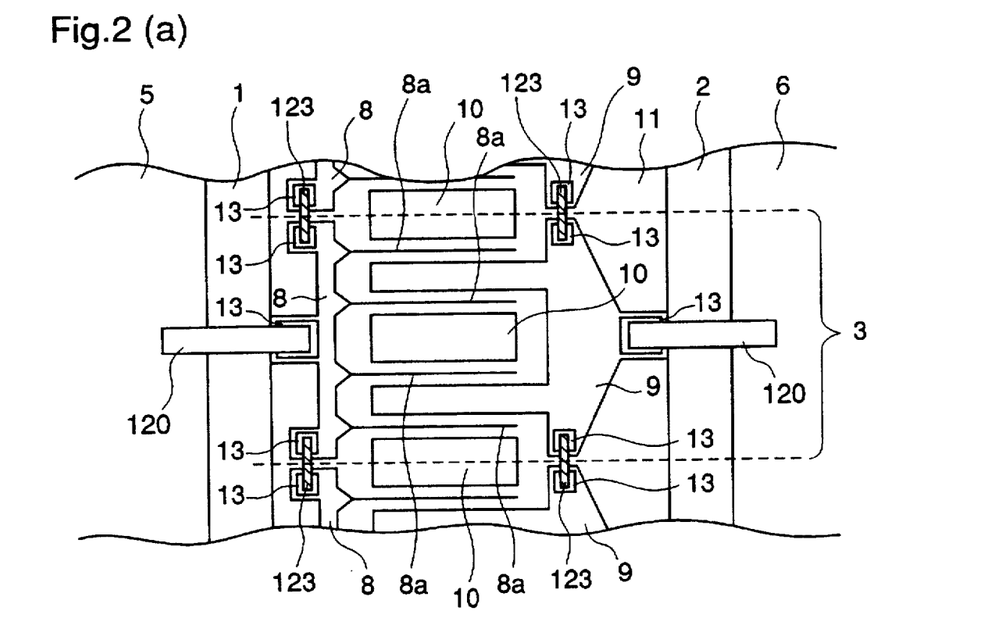
FIGS. 2(a) and 2(b) are a plan view illustrating an integrated circuit device according to a second embodiment of the present invention and a plan view illustrating a fabricating method therefor, respectively.

FIG. 2(a) is a plan view illustrating an FET 3 of an integrated circuit device in an enlarged view, in accordance with a second embodiment of the present invention. In FIG. 2(a), reference numeral 8 designates a gate electrode of an FET. Numeral 8a designates a multifinger gate. Numeral 9 designates a drain electrodes. Reference numeral 10 designates a source electrodes. Numeral 13 designates an insulating film aperture. Numeral 123 designates a conductive wiring employing a thermoplastic resin substance comprising thermoplastic polyimide resin including conductive particles. Other reference numerals used in FIG. 2(a) designate the same or corresponding elements of FIG. 1(a). The conductive wiring 123 connects the adjacent gate electrodes of the FETs and the adjacent drain electrodes of the FETs, respectively. The size of a region for connecting the conductive wiring 123 employing thermoplastic resin material to the electrodes of the FET 3 is smaller than 20 μm×20 μm compared to a region of 100 μm×100 μm that is required for wire bonding. In addition, an insulating film for protecting the surface of the FET 3 is formed on the entire surfaces of the FETs 3 other than the insulating film aperture 13 and the semiconductor substrate 11. Although not shown in this figure, the source electrodes of all the FETs are connected by air bridges with each other as in the above-described prior art integrated circuit device.

A description is given of a method of fabricating the integrated circuit device in accordance with the second embodiment of the present invention. FIG. 2(b) is a plan view illustrating the method of this embodiment. In FIG. 2(b), the same reference numerals as in FIG. 2(a) designate the same parts. The fabricating methods of the input impedance matching circuit 5 and the output impedance matching circuit 6 are the same as in the first embodiment and the description will be omitted.

First of all, operating layers of a plurality of FETs, a plurality of gate electrodes 8, multifinger gates 8a, drain electrodes 9, and source electrodes 10 are formed on a semiconductor wafer, air bridges (not shown in the figure) connecting the source electrodes are formed, an insulating film protecting the entire surfaces of the FETs are formed, and thereafter, insulating film apertures 13 are formed. Next, the electrical characteristics of the respective FETs are measured and thereafter, the respective semiconductor substrates 11 on which a series of FETs constituting an integrated circuit device are formed are cut out from a semiconductor wafer. Among the semiconductor substrates 11 which are cut out as described above, only those which have uniformity of some degree in the electrical characteristics of the FET formed on the respective substrates are employed to construct an integrated circuit device together with the input side substrate 5 and the output side substrate 6. This state is shown in FIG. 2(b). Finally, the input impedance matching circuit 5 and the gate electrodes 8 of each FETs as well as the output impedance matching circuit 6 and the drain electrodes 9 of each FET are respectively connected by thermoplastic resin substance 120, and the gate electrodes of adjacent FETs and the drain electrodes of adjacent FETs are respectively connected by conductive wires 123 using the thermoplastic resin substance. The thermoplastic resin substances 120, 123 are arbitrary shapes attached to the substrate by a method of patterning and etching or by attachment in a seal shape, and heated to about 200°–250° C. by such as laser irradiation, thereby adhering the same to the substrate, as in the first embodiment. Thus, an integrated circuit device shown in FIG. 2(a) is fabricated.

In this second embodiment, the mutually adjacent gate electrodes 8 and the mutually adjacent drain electrodes 9 of the FETs 3 are, respectively, connected by the conductive wiring 123 using the thermoplastic resin substance. The connection of the conductive wiring 123 with the respective electrodes is performed at an insulating film aperture 13. Generally, in a high output power FETs in which a plurality of FETs are connected in parallel, the electrical characteristics of the respective FETs 3 may be nonuniform due to factors such as a fabrication process and the like, whereby the integrated circuit device may have deterioration in the device characteristics. When the electrodes of all the FETs are integrated with each other and all the electrodes of the FETs are connected with each other when these FETs are formed on the semiconductor substrate 11 as in the above-described prior art device, the electrical characteristics of respective FETs cannot be inspected and nonuniform operation of the FETs cannot be detected, whereby there is a large reduction in the fabrication yield. On the contrary, in the second embodiment of the present invention, it is possible to measure the electrical characteristics of the FET after forming FETs on the semiconductor substrate 11 and before connecting the FETs with the input side substrate and the output side substrate. Thereafter, the respective electrodes of the FETs which are adjacent to each other are connected, and accordingly, the nonuniform operation of the above-described FETs can be inspected. Therefore, by constructing an integrated circuit device using only a semiconductor substrate 11 having FETs with uniform characteristics, the yield of an integrated circuit device can be enhanced. Meanwhile, although it is also possible to connect the electrodes of the FETs which are adjacent to each other with a wire in order to bond a wire onto an electrodes of an FET, it is required in that instance to secure an electrodes region having a large area, about 100 μm×100 μm, thereby lengthening the distance between the FETs, lowering the power density of the high output integrated circuit device, and deteriorating the efficiency of synthesis of a high frequency signal. On the contrary, if a thermoplastic resin substance is employed for conductive wiring connecting electrodes of the FETs as in the second embodiment, the region for connecting the electrodes of the FETs with this wiring is sufficient in an area below 20 μm×20 μm, and the distance between the FETs can be made approximately equal to that in the prior art integrated circuit device in which the electrodes of the FETs are formed integrally, whereby a high power integrated circuit device having a power density that is approximately equal to that of the prior art device is fabricated, and there is no deterioration in the efficiency of synthesis of a high frequency signal.

In this second embodiment of the present invention, the conductive wiring 123 using the above-described thermoplastic resin substance may be an electrical conductor, or it may be a resistor having a resistance of about several Ω. Meanwhile, by selecting the material of the conductive particles in the thermoplastic resin, the density of the conductive particles, the width and thickness of the thermoplastic resin substance, and the like appropriately, it is easily possible to obtain a desired resistance. For example, for a resistivity of about $10^{-4}$ Ωcm, in order to obtain a thermoplastic resin material having a resistance of 1Ω, the thickness, width, and length may be made 5 μm, 100 μm, and 500 μm, respectively. In this way, by making some or all of the conductive wirings electrical resistors, it is possible to prevent undesirable oscillation caused by a signal loop formed over the FETs.

For the above-described conductive wiring 123, instead of a thermoplastic resin substance, a metal such as Au, Al and the like, as a good electrical conductor may be employed, or a refractory metal such as WSi as an electrical resistor may be employed.

Embodiment 3

A third embodiment of the present invention will be described.

Figure 3:
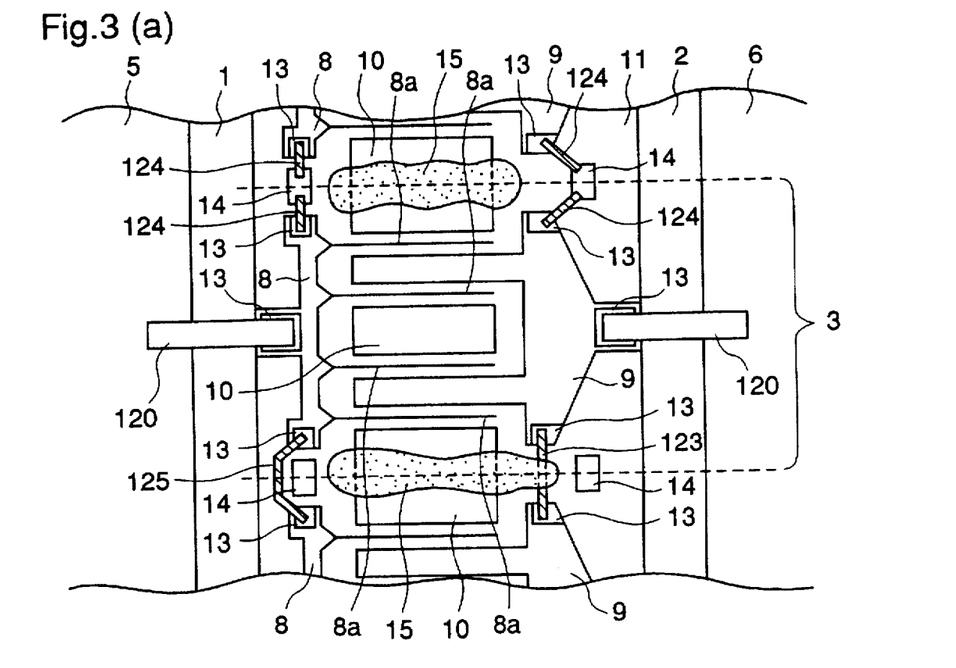
FIGS. 3(a) and 3(b) are a plan view illustrating an integrated circuit device according to a third embodiment of the present invention and a plan view illustrating a fabricating method therefor, respectively.

FIG. 3(a) is a plan view illustrating an FETs portion of an integrated circuit device in accordance with a third embodiment of the present invention. In FIG. 3(a), numeral 14 designates a resistor such as a metal thin film resistor, a semiconductor resistor, and the like. Numeral 15 designates a magnetic material comprising thermoplastic polyimide including magnetic particles such as ferrite. Numerals 124, 125 designate conductive wirings employing a thermoplastic resin substance comprising such as thermoplastic polyimide including conductive particles. The same reference numerals designate the same elements as shown in FIGS. 1(a) and 2(a). The resistor 14 can be connected to the conductive wirings 123, 124, and 125 by adhering the thermoplastic resin substance onto the resistor 14. The adjacent gate electrodes or the adjacent drain electrodes of the FETs are respectively directly connected with each other by the conductive wirings 123, 125 or by the conductive wirings 124 via a resistor 14. In addition, a magnetic material 15 is provided in the vicinity of the boundary of the FET. Also in this third embodiment, as in the second embodiment, the size of the region for connecting the conductive wirings 123, 124, and 125 comprising a thermoplastic resin substance with the resistor 14 and the electrodes of the FET 3 are sufficient with an area smaller than 20 μm×20 μm. The insulating film for protecting the surface of the FET 3 is formed on the entire surface of the FET 3 and the semiconductor substrate 11 other than the insulating film aperture 13. Although not shown in the figure, the source electrodes of all the FETs are connected with each other by the above-described air bridges.

A description is given of a method of fabricating the integrated circuit device in accordance with the third embodiment of the present invention. FIG. 3(b) is a plan view illustrating a method of fabricating an integrated circuit device in accordance with the third embodiment of the present invention. In FIG. 3(b), the same reference numerals as in FIG. 3(a) designate the same parts. The method for fabricating the input impedance matching circuit 5 and the output impedance matching circuit 6 are the same as in the first embodiment and a description will be omitted. First of all, on a semiconductor wafer, operating layers of a plurality of FETs, a plurality of gate electrodes 8, multifinger gates 8a, drain electrodes 9, source electrodes 10, and a plurality of resistors 14 such as a metal thin film resistor and a semiconductor resistor are formed, air bridges connecting the source electrodes (not shown in the figure) and an insulating film for protecting the surface of the FET are formed on the entire surface, and an insulating film aperture 13 is formed on the insulating film. Next, the electrical characteristics of respective FET are measured, undesirable oscillation is evaluated, and the semiconductor substrate 11 on which a series of FETs, each constituting the respective integrated circuit devices are formed, are cut out from the wafer. Among the semiconductor substrates 11 which are cut out as described above, those having uniformity of some degree in the electrical characteristics of the FETs in the respective substrates are employed to construct an integrated circuit device together with the input side substrate 5 and the output side substrate 6. The state is shown in FIG. 3(b). Next, the impedance matching circuit 5 and the gate electrodes 8 of the respective FETs are connected by the thermoplastic resin substance 120 and the output impedance matching circuit 6 and the drain electrodes of the respective FETs are connected by the thermoplastic resin substance 120. In addition, in accordance with the evaluation results of undesirable oscillation of the respective FETs, the gate electrodes of adjacent FETs and the drain electrodes of adjacent FETs are connected by the conductive wiring 124 employing the thermoplastic resin substance via the resistor 14 or are directly connected by the conductive wirings 123, 125, respectively. Further, in accordance with the evaluation result of the undesirable oscillation of the FET, the magnetic material 15 comprising a thermoplastic resin such as a thermoplastic polyimide including magnetic particles such as ferrite is formed on the source electrodes in the vicinity of the boundary of the FET 3. The method of forming the thermoplastic resin substances 120, 123, 124, and 125 and the magnetic material 15 comprising thermoplastic resin are the same as in the first and the second embodiments. In this way, the integrated circuit device shown in FIG. 3(a) is fabricated.

Since in this third embodiment after the electrical characteristics of the respective FETs are measured in a wafer state, as in the second embodiment, the gate electrodes and the drain electrodes of the FETs are connected with the conductive wirings, nonuniform operation of each FET can be inspected and the fabrication yield of an integrated circuit device is enhanced.

In this third embodiment, a resistor 14 comprising a metal thin film or a semiconductor resistor is previously provided between the FETs 3, and respective electrodes may be connected by that resistor 14 or respective electrodes may be connected directly, in accordance with the presence of undesirable oscillation. By doing so, undesirable oscillation can be prevented, and when it is confirmed that undesirable oscillation is not generated, it is possible to connect the electrodes of adjacent FETs without providing the resistor 14 therebetween, whereby the loss of a signal due to connection of the resistor 14 to the electrodes of the FET can be suppressed to a minimum.

In this third embodiment, undesirable oscillation can be prevented easily by connecting the electrodes of the FETs or connecting the electrodes of the FETs and the resistor 14 employing the conductive wirings 123, 124, and 125 comprising only the thermoplastic resin substance as an electrical conductor. In other words, it is not required to selectively employ conductive wirings comprising a thermoplastic resin substance as an electrical resistor at a portion and conductive wiring comprising a thermoplastic resin substance as an electrical conductor at another portion in accordance with the presence of undesirable oscillation of the respective FETs as in the second embodiment.

In this third embodiment, since the magnetic material 15 is provided in addition to the resistor 14 between the FETs 3, it is possible to effectively prevent the undesirable loop oscillation of the FET. Further, as shown in FIG. 3(a), it is also possible to provide a magnetic material 15 on the conductive wiring 123 comprising a thermoplastic resin substance connecting the electrodes of the FET, whereby the oscillation signals are significantly attenuated on a path of the loop oscillation and undesirable oscillation can be prevented. In addition, by particularly employing a thermoplastic resin substance as an electrical conductor, the wiring can be formed at quite a narrow region of, about several tens of μm in length between the FETs, with high precision, and a magnetic material 15 can be formed without increasing the distance between the FETs in order to provide the magnetic material. Accordingly, even when the magnetic material 15 is present, the power density of the high power integrated circuit device is not deteriorated, and the efficiency of synthesis of a high frequency signal can be preserved.

As the conductive wirings 123, 124, 125, instead of a thermoplastic resin substance, a metal such as Au, Al as an good electrical conductor may be employed, or a refractory metal such as WSi as an electrical resistor may be employed.

What is claimed is:

1. An integrated circuit device comprising:

a first substrate;

circuit elements including a plurality of transistors having respective source, drain, and gate electrodes, said transistors being disposed in a linear array, side-by-side, on said first substrate, at least one of the gate electrodes, the source electrodes, and the drain electrodes of adjacent transistors in the linear array being electrically independent of each other;

an electrically insulating film covering the transistors and including a plurality of through-holes providing access to the gate electrodes, the source electrodes, and the drain electrodes; and a plurality of respective electrically conductive wirings electrically connecting, through the through-holes, in parallel, like electrodes of adjacent transistors that are electrically independent from each other.

2. The integrated circuit of claim 1 comprising a second substrate including a first impedance matching circuit, a third substrate including a second impedance matching circuit, said first substrate being disposed between said second and third substrates, and a plurality of electrical connections including a thermoplastic resin containing electrically conductive particles electrically connecting said plurality of transistors to said first and second impedance matching circuits.

3. The integrated circuit device of claim 2 including lands on said second and third substrates and electrically conductive connectors comprising a thermoplastic resin containing electrically conductive particles connecting said first and second impedance matching circuits to said lands.

4. The integrated circuit device of claim 1 comprising electrical resistors located between at least some adjacent transistors on said substrate, said electrical resistors, being part of said electrically conductive wirings.

5. The integrated circuit device of claim 1 wherein said electrically insulating film covers said source electrodes of said transistors and including a magnetic material disposed on said electrically insulating film and covering said source electrodes of said transistors.

6. The integrated circuit device of claim 5 wherein said magnetic material comprises ferromagnetic particles contained in a thermoplastic resin.

7. The integrated circuit device of claim 1 wherein said electrically conductive wirings comprise a thermoplastic resin including electrically conductive particles.

* * * * *